(12) United States Patent
Frederick, Jr. et al.

(10) Patent No.: US 9,653,413 B2
(45) Date of Patent: May 16, 2017

(54) POWER GRID CONDUCTOR PLACEMENT WITHIN AN INTEGRATED CIRCUIT

(71) Applicant: ARM LIMITED, Cambridge (GB)

(72) Inventors: Marlin Wayne Frederick, Jr., Austin, TX (US); Karen Lee Delk, Austin, TX (US)

(73) Assignee: ARM Limited, Cambridge (GB)

( * ) Notice: Subject to any disclaimer, the term of this patent is extended or adjusted under 35 U.S.C. 154(b) by 5 days.

(21) Appl. No.: 14/307,574

(22) Filed: Jun. 18, 2014

(65) Prior Publication Data

US 2015/0371959 A1    Dec. 24, 2015

(51) Int. Cl.
*H01L 21/58* (2006.01)
*H01L 23/58* (2006.01)
*G06F 17/50* (2006.01)

(52) U.S. Cl.
CPC .......... *H01L 23/58* (2013.01); *G06F 17/5077* (2013.01); *H01L 2924/0002* (2013.01)

(58) Field of Classification Search
CPC ...................................................... H01L 23/58
See application file for complete search history.

(56) References Cited

U.S. PATENT DOCUMENTS

| 4,161,662 A | * | 7/1979 | Malcolm | H01L 27/11807 257/204 |
|---|---|---|---|---|
| 2010/0095263 A1 | * | 4/2010 | Frederick | G06F 17/5077 716/129 |
| 2010/0155783 A1 | * | 6/2010 | Law | H01L 27/0207 257/206 |

* cited by examiner

*Primary Examiner* — Fernando L Toledo
*Assistant Examiner* — Valerie N Newton
(74) *Attorney, Agent, or Firm* — Nixon & Vanderhye P.C.

(57) ABSTRACT

An integrated circuit 2 is formed with standard-cell power conductors 14 which are overlaid by power grid conductors 20. The power grid conductors are offset in a direction transverse to the longitudinal axis of the power grid conductors relative to their underlying standard-cell power conductor. This has the effect of increasing the conductor spacing possible to one side of the power grid conductor. Accordingly, a wider than minimum width power grid conductor may be provided which blocks only one of its adjacent track positions from being used by a routing conductor 22.

16 Claims, 14 Drawing Sheets

8.25T P&R Details

- Track Re-Assignment script for EDI
    *delete Track -layer M2 -dir Y*
    *set i o*
    *set offset_for_each_row 0.008*
    *set cell_height [dbDBUToMicrons [dbHeadStdCellHgt [dbgHead]]]*
        *while { $i < 100 } {*
            *set track_offset [expr {$i \*$cell_height +$offset_for_each_row}]*
            *create Track -start $track_offset -num 8 -step 0.064 -dir Y -layer M2*
            *incr i*
        *}*

- Track Re-Assignment script for ICC
    *set i o*
    *remove_track -layer M2 -dir Y*
    *set num_of_rows [get_attribute [get_core_area] number_of_row]*
        *while { $i < $num_of_rows } {*
        *set offset 0.008*
        *set cellheight [get_attribute [get_core_area] tile_height]*
            *set j [expr {$i \*$cellheight +$offset}]*
    *create_track -dir Y -layer M2 -coord $j -count 8 -space 0.064*
        *incr i*
        *}*

FIG. 15

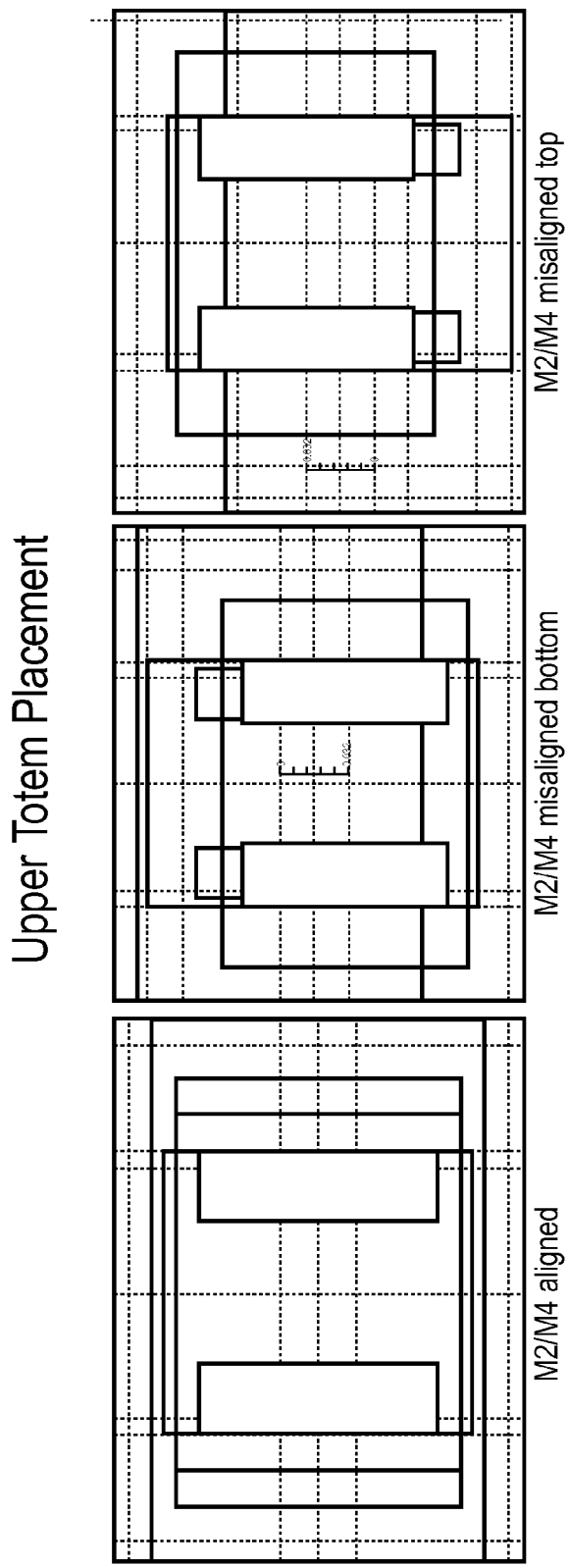

POWER GRID CONDUCTOR PLACEMENT WITHIN AN INTEGRATED CIRCUIT

BACKGROUND

This invention relates to the field of integrated circuits. More particularly, this invention relates to the layout of power grid conductors within integrated circuits.

It is known to form integrated circuits with wires (conductors) formed to carry power and signals to be processed. Wire pitches (a pitch is the sum of the width and space of the wire) may no longer be single multiples of each other, e.g. half pitches may be used. SC (Standard Cell) placement and routing tools are predicated upon routing wires on predetermined pitches and at predetermined positions within critical layers. There are various industry placement and routing tools which follow these conventions. For example, the routing tool routes the wires based upon the M2 pitch and the standard cell is an integral (or on half integral) number of M2 pitches 6, 6.5, 7, 7.5, 9, 9.5, etc. The M1 wires are within the standard cell. M1 power wires may run parallel to the M2 power and signal routing wires, but other wires within the M1 layer may run both parallel to and perpendicular to the overlying M2 wires. Higher levels of wires (e.g. M3, M4, etc) may run in alternating perpendicular directions.

The M2 wires may placed on the pitch as illustrated by the solid wires indicated in FIGS. 4, 5 and 6 of the accompanying drawing. These pitches have usually been on simple multiples of each other, 1×, 1.5×, 2×, 3×, 4×. Typically the wires for the lower levels (M1, M2 etc) are both the thinnest (vertical thickness) and the smallest pitch (horizontal width and space). These wires connect to the transistor's gate, source, drain, and also connect to the thicker wires above. These thicker wires (vertical thickness) can carry more current, but are also a higher pitch (larger horizontal width and space).

Placement and routing tools seek to provide dense routing of power, ground, and signal wires through different layers of wires and the vias that connect the wires from different layers. They typically route wires on the M2 wiring track. When the wire pitches are no longer on simple multiples, then the least common multiples become quite large >5, 10, 40, 80. If one were to use the least common multiple between two wires, then the pitches can become so large that wiring density is sacrificed. In addition, it is not unusual for the wire that is closest to the transistors, typically called M1, to have a larger pitch than the M2 even though it is the same thickness. This is due to connectivity issues as it connects to the gate, source, and drain of transistors. In addition, the via placement also has become very problematic.

It is known to provide integrated circuits formed of a plurality of standard cells (SCs) connected to draw power from a plurality of standard-cell power conductors. These standard-cell power conductors are connected to power grid conductors in a different layer. The power grid conductors overlap (lie on top of) and have their longitudinal axis centered over the longitudinal axis of the standard-cell power conductors.

The conductor (track/wire) pitch within an integrated circuit is typically set to correspond to the sum of the minimum conductor width and the minimum conductor spacing of the manufacturing process such that substantially parallel conductors may be formed with closely packed positions. A problem with this approach is that when one of the powered grid conductors is made wider than normal, e.g. so as to reduce resistive losses within a power grid conductor, this wider conductor encroaches into the minimum conductor spacing such that an adjacent position for a track may not be used as otherwise that track would violate the minimum track spacing requirement.

SUMMARY

Viewed from one aspect the present technique provides an integrated circuit comprising:

a plurality of standard cells having a plurality of standard-cell conductors in a standard-cell conductor layer, said plurality of standard-cell conductors disposed substantially parallel to each other; and a plurality further conductor in a further layer separate from said standard-cell conductor layer, said plurality of further conductors disposed substantially parallel with said plurality of standard-cell power conductors, wherein at least one of said further conductors is disposed at an offset position relative to a sequence of conductors starting at a boundary of a standard cell and with longitudinal axis spaced by a uniform pitch from each other.

The technique modifies the standard positions of the further conductors away from their conventional positions in a way that may facilitate routing. It may also be necessary to vary the via positions in a similar way to target the modified conductor positions.

At least some example embodiments offset the longitudinal median axis of the further conductor from the corresponding axis of the underlying standard-cell conductor, this can have the effect of moving the further conductor closer to one of its neighbours and further from the other of its neighbours. Accordingly, this makes it more likely that the track position which the further conductor is offset away from can be used without violating the minimum conductor spacing.

The conductor may be a power conductor or signal routing conductors in both the standard cell layer and/or the further layer.

At least some example embodiments operate such that they (through an addition process (script)) modify the results of the SC routing tool so that the M2 power grid is placed in a manner that is "off grid".

The tracks which are provided in the same layer as the power grid conductors may be routing conductors that are disposed substantially parallel with the power grid conductors. The power grid conductors and routing conductors are disposed at distances from each other meeting a minimum conductor spacing requirement as imposed by the process design rules being employed.

In order to achieve a high density, the routing conductors may have a routing-conductor width and be disposed relative to one another such that a distance between adjacent ones of the routing conductors is substantially equal to a minimum distance that meets the conductor spacing requirement. This permits the routing conductors to be provided with high density, but does introduce the problem that if a conductor wider than a routing conductor is desired for use as a power grid conductor, then this will necessitate omitting at least one routing conductor if the routing conductor minimum spacing is not to be violated.

In some embodiments the standard-cell power conductors and the power grid conductors may be disposed along opposite parallel edges of standard cells. Standard cells may be provided in a mirrored and non-mirrored form on either side of the power conductors in order to improve the circuit density. Some of the power conductors will provide a VDD level connection and others a ground level connection. The VDD level connection and the ground level connection may have the same or differing widths.

The routing conductors may be separated from one another by a substantially constant pitch value P. The standard cells may be arranged to have a dimension perpendicular to the routing conductors which is a positive integer multiple of this pitch value P greater than 3 in order to permit the power grid conductors to be accommodated. Within such an arrangement, all of the power grid conductors may be offset. As an alternative, the standard cells may have a dimension perpendicular to the routing conductors equal to an integer multiple of the pitch value P plus a half pitch value P/2 and in this circumstance alternating ones of the power grid conductors may be offset.

In some embodiments the standard cell conductor layer is a metal one layer and the further layer, in which the powered grid conductors and the routing conductors, may be formed is a metal 2 layer.

Viewed from another aspect the present technique provides a method of forming a layout of an integrated circuit including a plurality of standard cells including standard cell conductors having standard cell conductor pitch $P_{SC}$, said method comprising the steps of:

forming an initial layout of further conductors at initial positions in a further layer overlying said standard cells, said further conductors having an initial further conductor pitch $P_{IFC}$, where $P_{IFC}$ is not equal to $P_{SC}$;

forming a modified layout by offsetting said further conductors from said initial positions such that said further conductors have a modified further conductor pitch $P_{MFC}$, and storing said modified layout in a non-transitory computer readable form.

The above, and other objects, features and advantages of this invention will be apparent from the following detailed description of illustrative embodiments which is to be read in connection with the accompanying drawings.

BRIEF DESCRIPTION OF THE DRAWINGS

FIGS. 13 to 15 schematically illustrates offsetting (dithering) an M2 layer to have a pitch better match to conductor with underlying standard cells; and FIGS. 16 to 18 schematically illustrate moving/offsetting via placement.

DESCRIPTION OF EXAMPLE EMBODIMENTS

Figure 1:
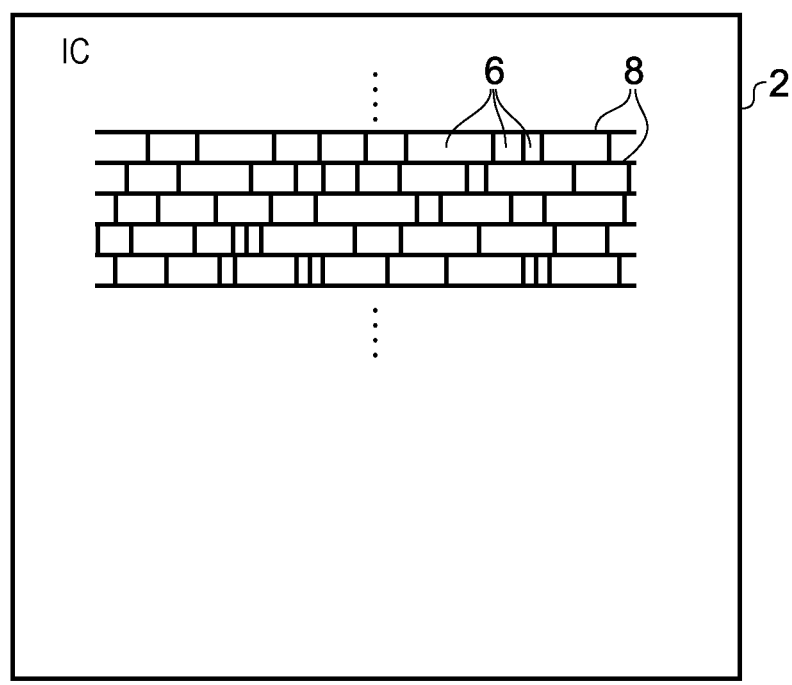
FIG. 1 schematically illustrates an integrated circuit formed of a plurality of standard cells drawing power from power grid conductors running through the array of standard cells.

FIG. 1 schematically illustrates an integrated circuit 2 including a plurality of standard cells 6 arranged with power grid conductors 8 supplying power from VDD and ground to the standard cells 6. This type of arrangement is typically used to form an integrated circuit based upon a standard cell library and a functional design of an integrated circuit (e.g. an RTL level design) together with a set of design rules for the manufacturing process used and employing a system of tools to generate the necessary masks for integrated circuit manufacture. As will be appreciated, such a synthesis process typically involves establishing a floorplan for the integrated circuit which includes the power supply conductors, including standard-cell power conductors in one layer and the power grid conductors in a different layer. Subsequent to this, the standard cells may be selected and placed so as to meet the functional requirements of the integrated circuit and then routing conductors laid out and connected. This way of synthesizing integrated circuits will be familiar to those in this technical field.

Figure 2:
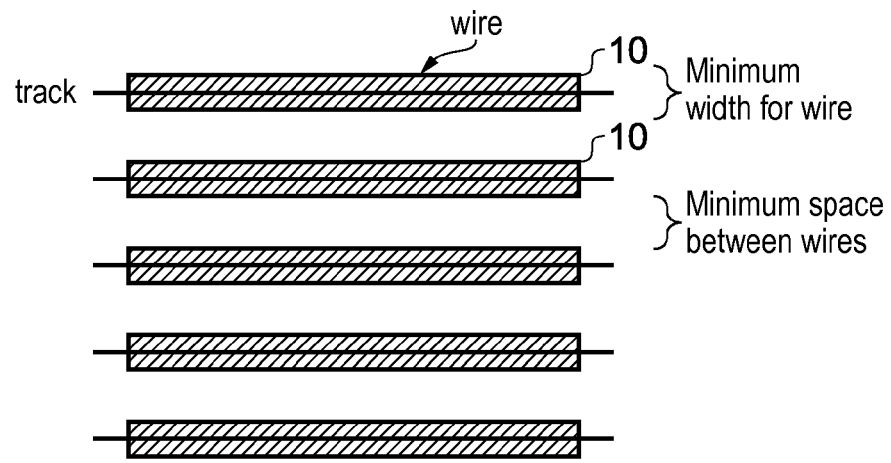
FIG. 2 schematically illustrates a plurality of conductors with an associated minimum conductor width and minimum conductor spacing.

FIG. 2 schematically illustrates a plurality of routing conductors 10 which are linear substantially parallel conductors centered on track positions as shown. The medium longitudinal axis of each of the routing conductors 10 lies directly overhead the line corresponding to the track position. As illustrated in FIG. 2 each of the routing conductors has a minimum width. There is also a minimum spacing between conductors which is associated with the design rules for the process being used to manufacture the integrated circuit. The sum of the minimum width and the minimum spacing corresponds to the pitch P of the track positions as illustrated in FIG. 2 in order to achieve a high density of potential routing. It will be understood from those familiar with this technical field that at small process geometries it is desirable to use conductors which are substantially parallel linear conductors as these are easier to reliably form at such small process geometries. Typically the conductors in each of the layers (e.g. metal 1 layer, metal 2 layer, etc) are formed directly overlying one another with their longitudinal median axis corresponding to a perpendicular projection of the longitudinal median axis of the underlying conductor. The conductors are arranged to lie directly over one another as the different layers are traversed. It is also possible for portions of the metal 1 layer to run perpendicular to the direction of the conductors in the metal 2 layer.

Figure 3:
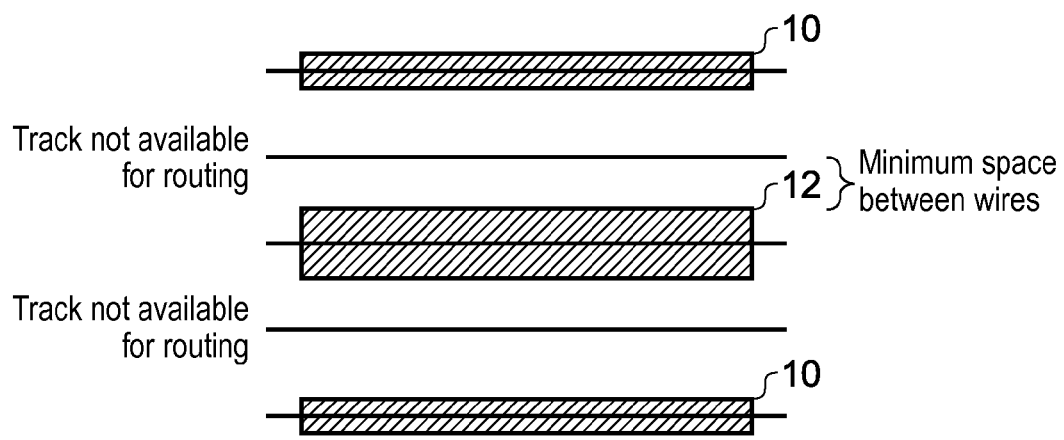
FIG. 3 schematically illustrates the effect of introducing a conductor of greater than the minimum conductor width.

FIG. 3 schematically illustrates the effect of a power grid conductor 12 being made wider than the minimum conductor width. The power grid conductor 12 may be made wider so as to reduce resistive losses through the power grid conductor 12. The effect of the wider power grid conductor 12 illustrated is that the two neighbouring track positions are no longer available for routing conductors 10 as routing conductors of the minimum conductor width placed at such locations would not have the minimum conductor spacing between themselves and the power grid conductor 12. As the routing tool (software) routes in integer multiples of M2 tracks, it will not place wires "off track" even though there is room to insert a wire. Accordingly the two adjacent track positions are left blank in order not to violate the minimum conductor spacing requirement.

Figure 4:
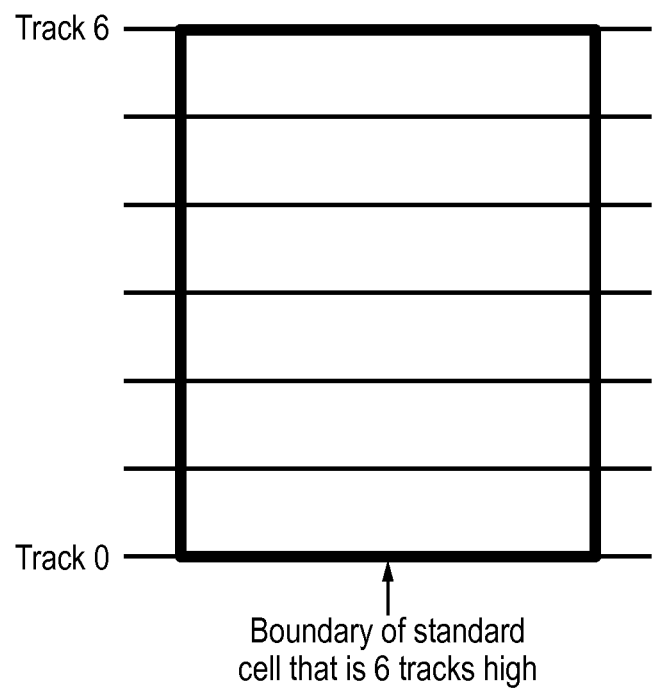
FIG. 4 schematically illustrates the position of a standard cell within a floorplan of conductor positions.

FIG. 4 schematically illustrates the boundary of a standard cell which is six tracks high placed within a floorplan of tracks with a constant track pitch P.

Figure 5:
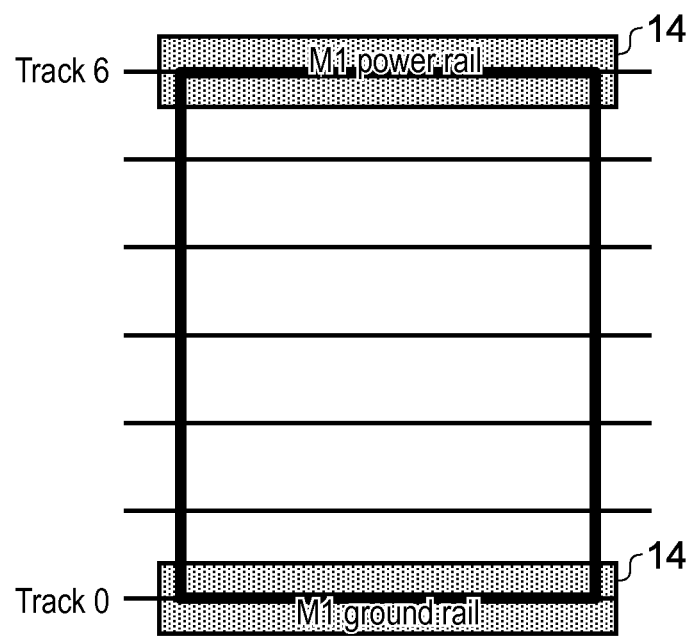
FIG. 5 schematically illustrates standard-cell power conductors provided in a metal one layer at the boundaries of a standard cell.

As illustrated in FIG. 5, standard-cell power conductors 14 may be provided in a metal one layer along parallel opposite edges of the standard cell boundary to provide power to the circuit elements within the standard cell.

Figure 6:
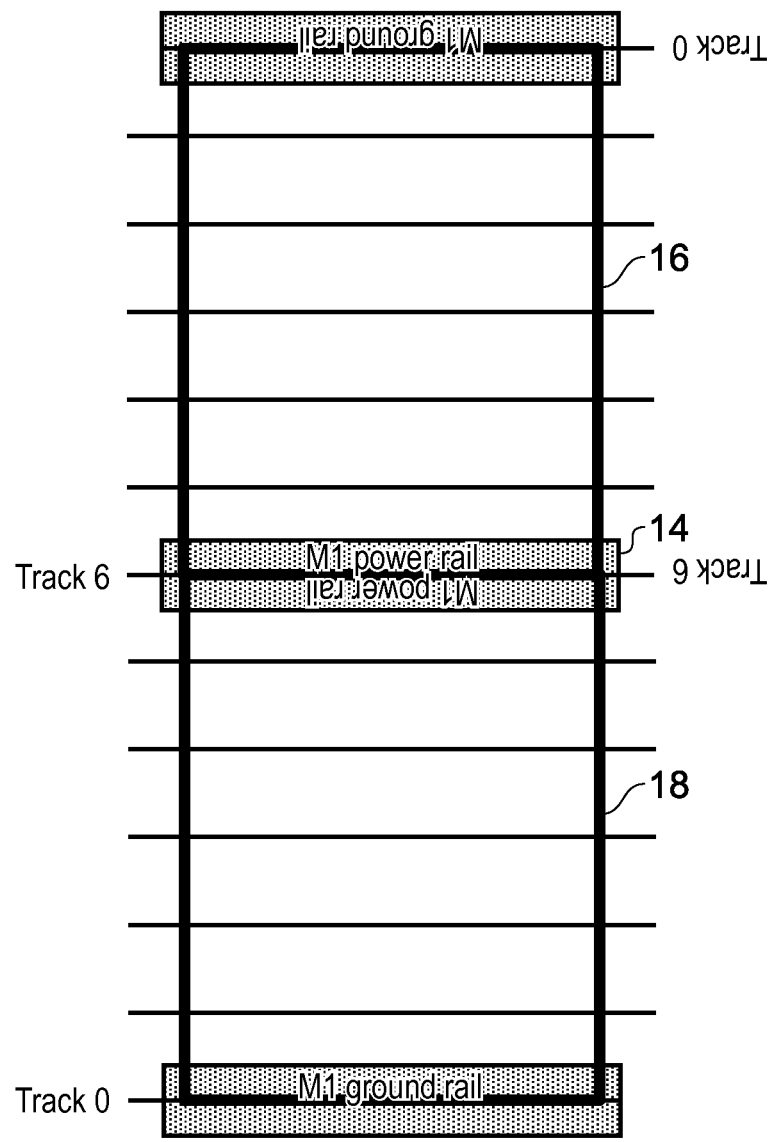
FIG. 6 schematically illustrates two standard cells provided in a mirrored arrangement.

FIG. 6 illustrates the arrangement whereby the standard cells are provided both in a normal form 16 and a mirrored form 18 to be disposed on opposite sides of a standard-cell power conductor 14. In this way, alternating power conductors 14 in the sequence of power conductors supply VDD, ground, VDD, ground, etc and an improved layout density may be achieved with each standard cell having access to both a VDD supply and a ground supply at one of its boundaries.

Figure 7:
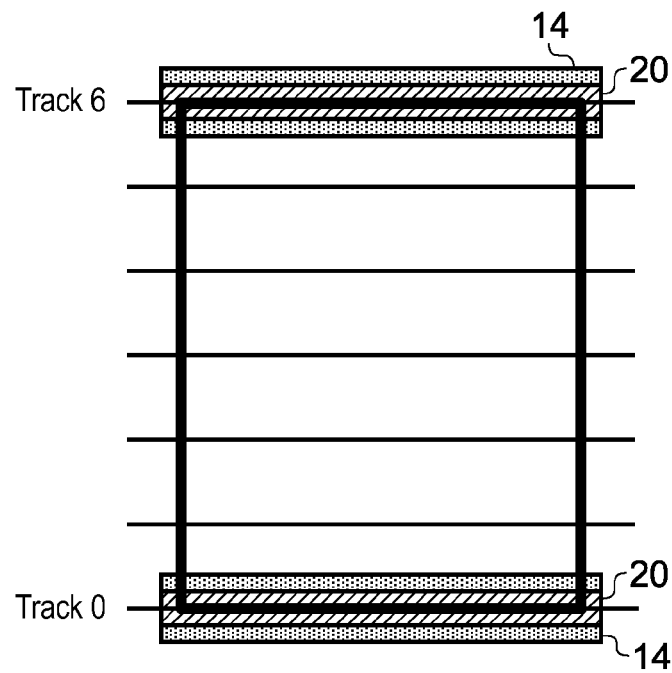
FIG. 7 schematically illustrates power grid conductors provided over standard-cell power conductors.

FIG. 7 schematically illustrates the use of a power grid conductor 20 in a metal two layer overlying and centered over the standard-cell power conductors 14. In this case, a minimum width conductor is employed for the power grid conductors 20 and accordingly the adjacent tracks are available for use as routing tracks.

Figure 8:
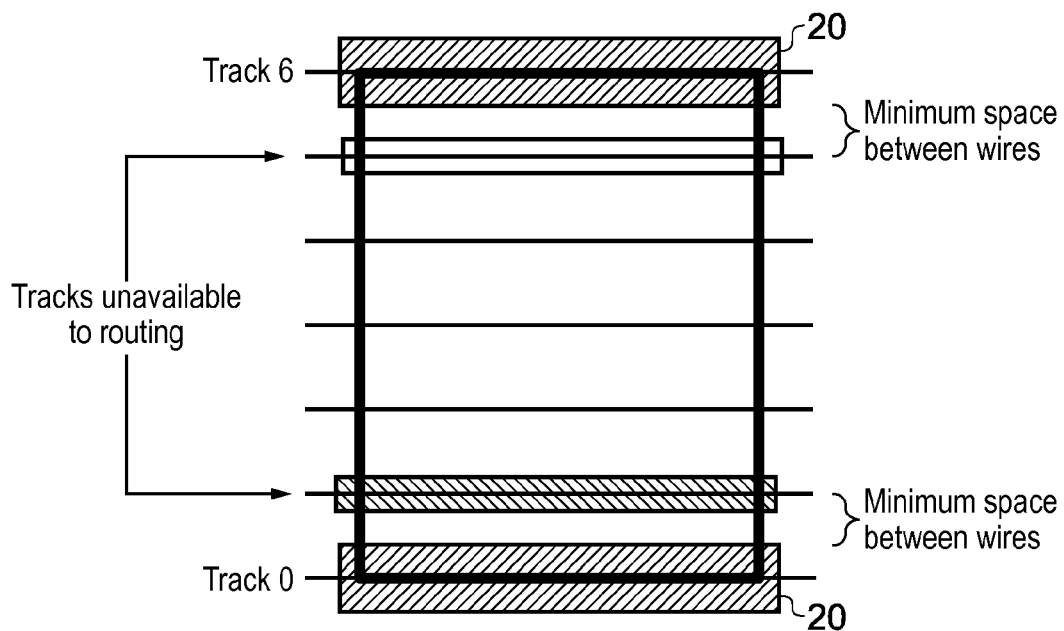
FIG. 8 illustrates the effect of wider than minimum power grid conductors in rendering neighbouring positions unavailable for use by routing conductors.

FIG. 8 illustrates the situation in which the power grid conductor 20 is provided in a form wider than the minimum conductor width (e.g. so as to reduce resistive losses within the power grid conductors 20) and accordingly these encroach upon the neighbouring track positions such that those neighbouring track positions are unavailable for use by routing conductors if the minimum conductor spacing requirement is to be met. In the example illustrated in FIG. 8, the power grid conductor 20 remains centered over its underlying track position access.

Figure 9:
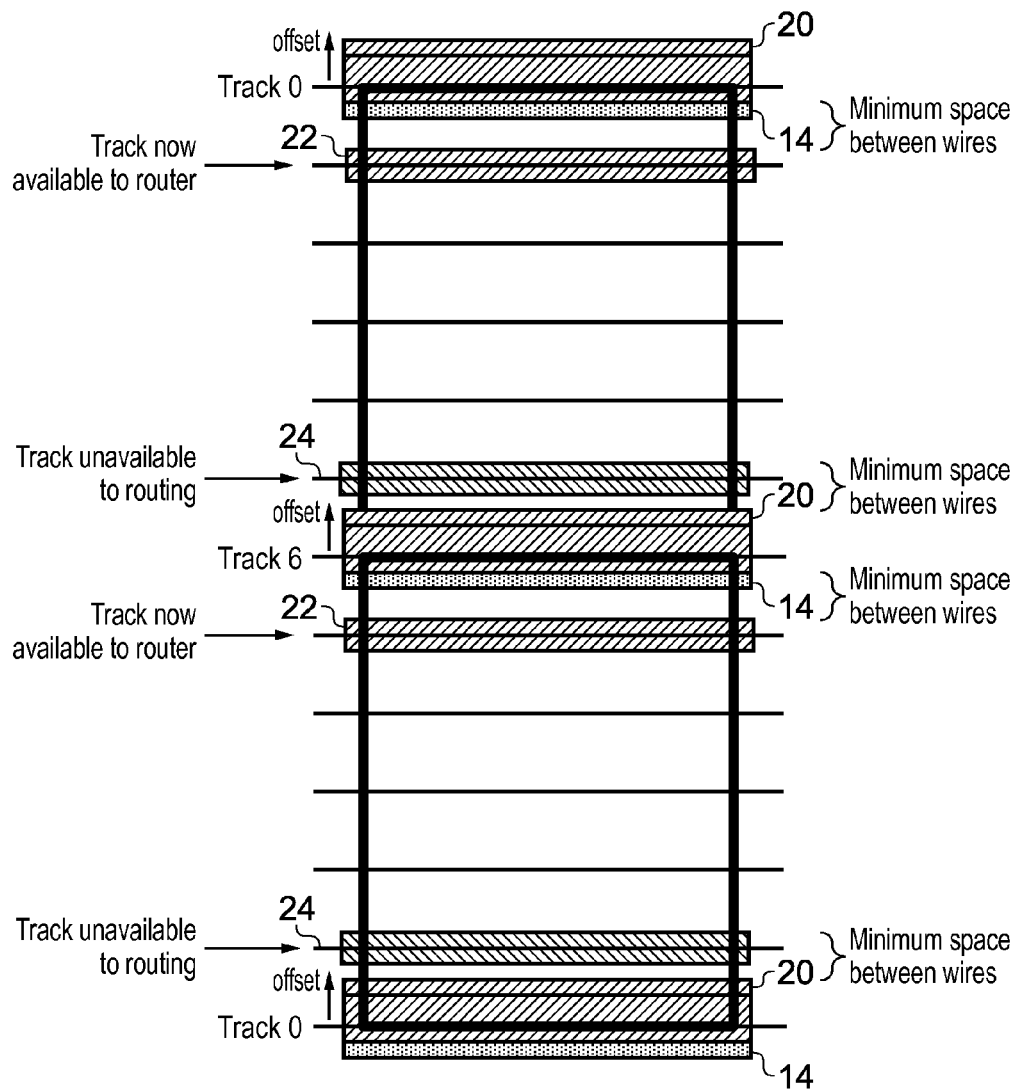
FIG. 9 schematically illustrates the effect of offsetting the power grid conductors.

FIG. 9 illustrates an embodiment in which the power grid conductors 20 are offset by an offset distance in a direction within the metal two layer (a layer separate from the layer containing the standard-cell power conductors 14). The offset is in a direction transverse to the grid conductor longitudinal median axis and is measured from a perpendicular projection into the metal two layer of the median longitudinal axis of the underlying standard-cell power conductor 14. The effect of this offset is that the power grid conductor 20 moves closer to one of its neighbouring track positions and further away from the other of its neighbouring track positions. This has result that one of these neighbouring track positions now becomes available for use by a routing conductor 22 as illustrated, and the number of routing tracks available to the router goes from 3 to 4. This offset of the M2 power wire may be provided by an additional process (script/step) that works "on top" of a standard place and route tool. The track positions 24 toward which the power grid conductors 20 have been offset are in practice unused as to use them would violate the minimum conductor spacing requirement. In FIG. 9 both the VDD and the ground power grid conductors are shown as offset, but in some embodiments only one of these need be offset.

The embodiment of FIG. 9 uses a standard cell which has a dimension transverse to the track direction which is an integer multiple of the track pitch P. Standard cell designs are also possible which have a dimension perpendicular to the track direction which is a half integer multiple of the track pitch, e.g. 3.5 pitches, 4.5 pitches, 5.5 pitches etc. In practice, there is a minimum standard cell dimension that can be achieved whilst still permitting power routing to the boundaries of the standard cell and a useful amount of routing conductors to be provided within the standard cell. A minimum standard cell dimension may be greater than three track pitches.

Figure 10:
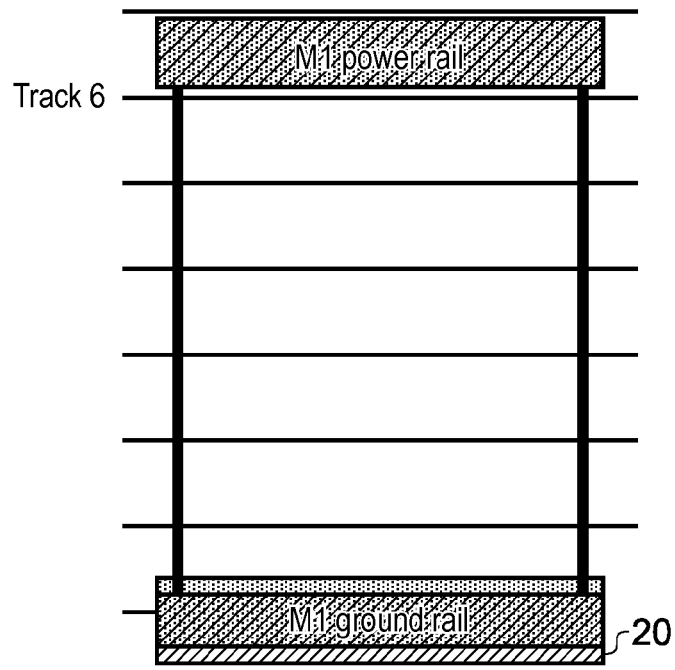
FIG. 10 schematically illustrates one example layout where the standard cell is a integer multiple plus a half of the track pitch.

The example illustrates in FIG. 10 is a standard cell with a dimension equal to 6.5 track pitches transverse to the track direction. In such embodiments, it may be desirable to only offset one of the power grid conductors 20 with the other remaining centered over the standard cell boundary. In this case, the M2 power rail is two channels wide (it blocks two M2 tracks) and allows five M2 signal wires.

Figure 11:
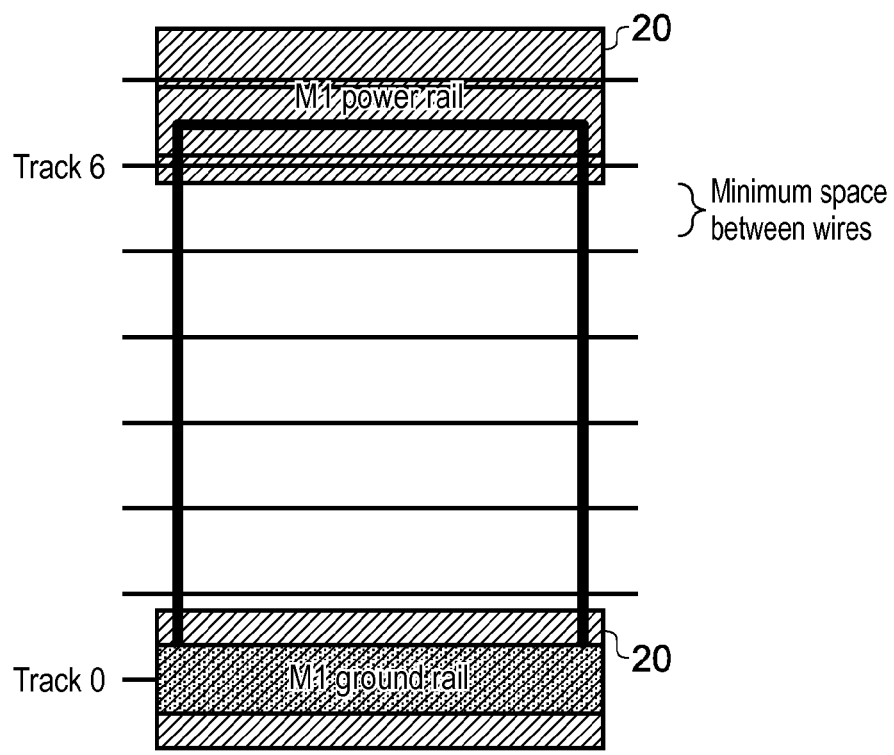
FIG. 11 is an alternative arrangement to FIG. 10 which may be suitable when the width of the power grid conductor is greater.

As the power grid conductor 20 becomes wider, as illustrated in FIG. 11, it may be more effective to offset a different one of the power grid conductors in such a system employing standard cells with a height which is an integer multiple of the track pitch plus a half. In this case the M2 power rail is three tracks wide and allows four signal wires.

In the examples illustrated herein the standard-cell power conductors are formed in the metal one layer and the power grid conductors and routing conductors are formed in the metal two layer. Other arrangements are also possible.

Power connection vias are provided between the power grid conductors and the standard-cell power conductors. Electrical power is routed into the standard cells via the power grid conductors, the power connection vias and the standard-cell power conductors.

All the example Figures included herein show the track lines as horizontal lines, but it will be appreciated that these lines may be vertical or some other orientation. The tracks which define the longitudinal directions of the conductors are substantially parallel to one another and the conductors are accordingly all substantially parallel to one another.

At least some example embodiments slide or "dither" the wires and vias so that they are off track and positioned to give improved wiring density (first priority) and wire attributes (second priority) either wire thickness (smaller resistance, improved EM/IR) or wire spacing (reduced line-to-line capacitance, coupling to adjacent wires).

This technique allows "dithering" using existing place and route tools to enhance their productivity with smaller geometry technology that does not support "simple" multiples of wire widths.

Figure 12:
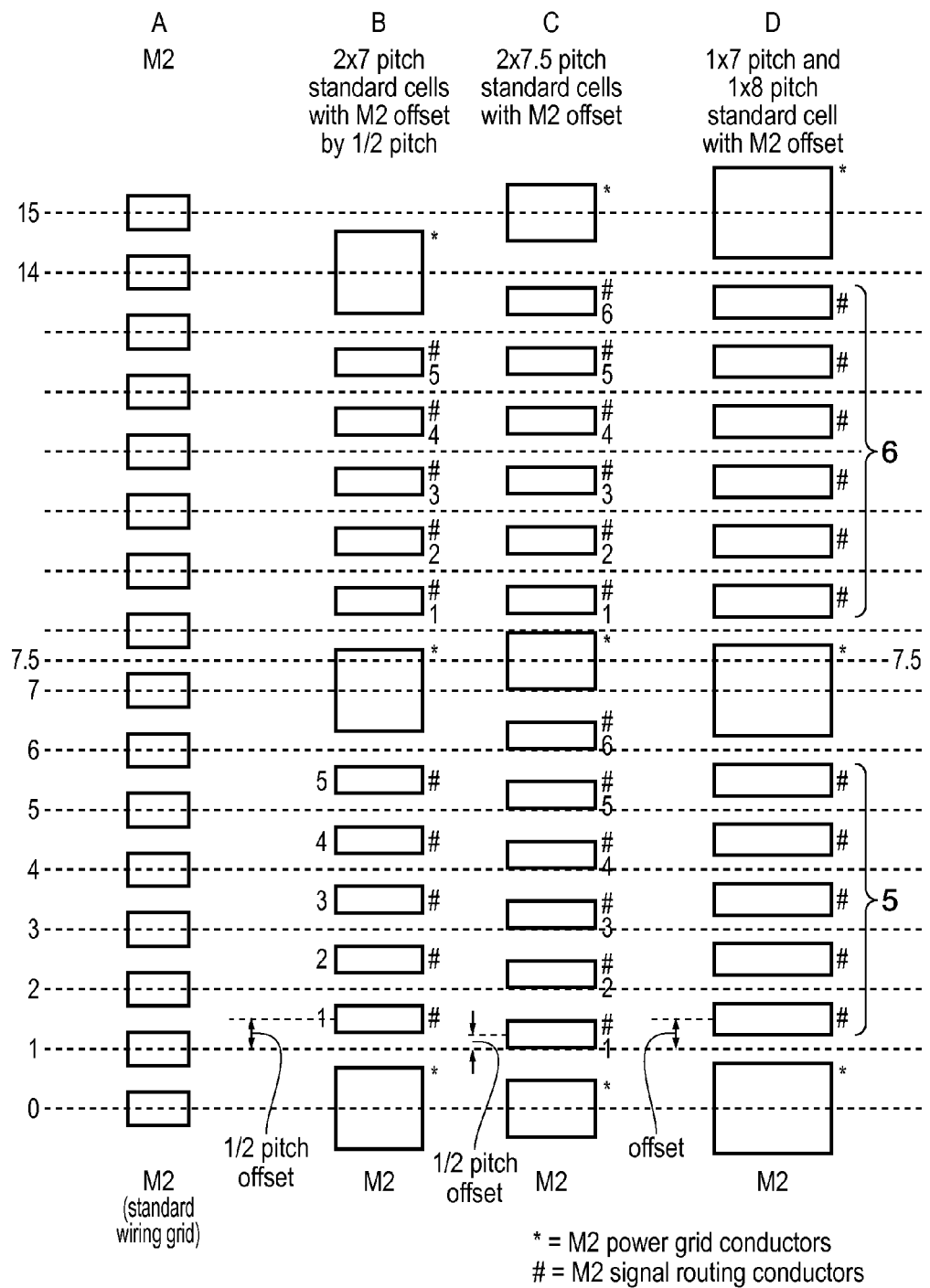
FIG. 12 schematically illustrates example embodiments in which the M2 signal routing layer is subject to an offset relative to the standard M2 grid positions.

FIG. 12 schematically illustrates example embodiments in which the M2 signal routing conductors are offset from the axis of the standard M2 wiring grid positions. In column A are illustrated the conductor positions (power conductors and signal routing conductors) in the standard M2 layer. Column 2 shows the M2 layer for connecting to two seven pitch standard cells with three trackwide power conductors. The signal routing conductors are offset by half a pitch from its normal position (as generated by the standard tools) and this permits five signal routing conductors to be formed without violating the minimum conductor spacing requirement (otherwise only four routing conductor could be used in the M2 layer if these directly overlay the M1 conductors).

Column C shows an example where the power conductors in the M2 layer are two tracks wide and the standard cells are seven and one half pitches tall. If the routing conductors in the M2 layer are shifted by half a pitch then six routing conductor are available compared to five without the shift.

Figure 13:
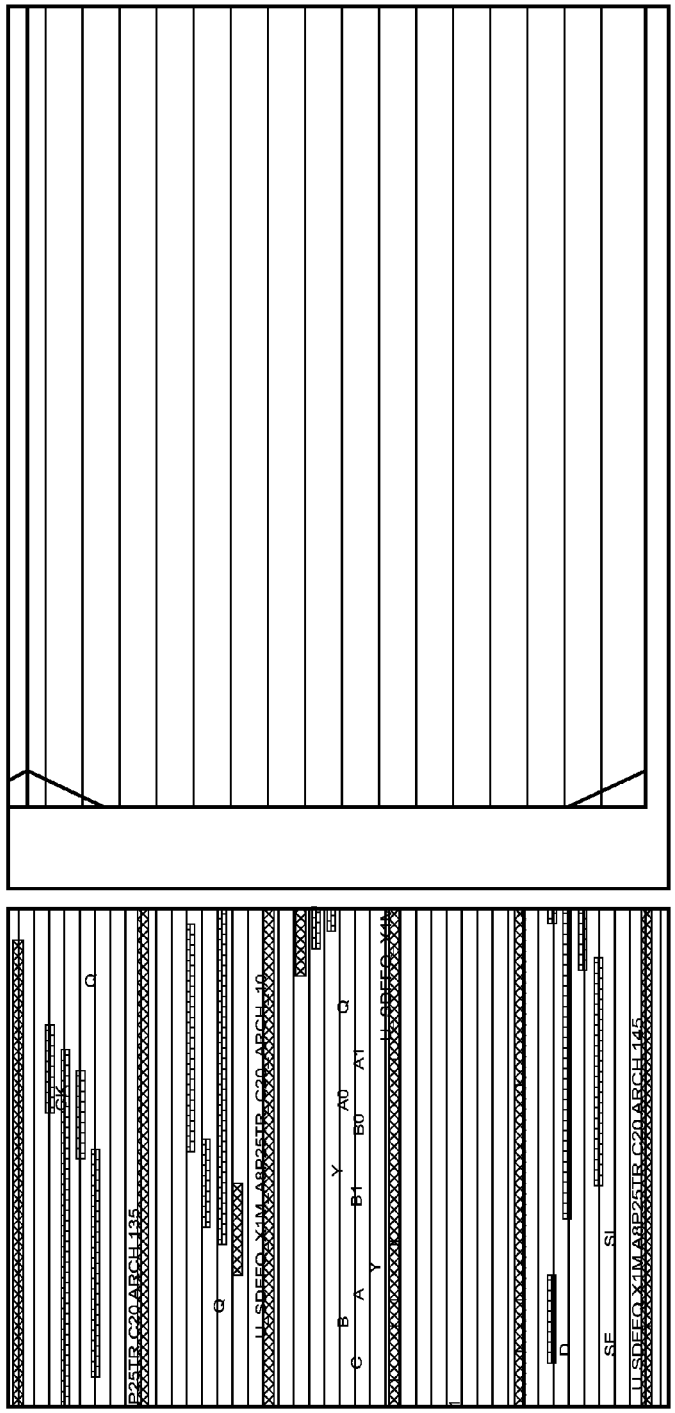
Figure 14:
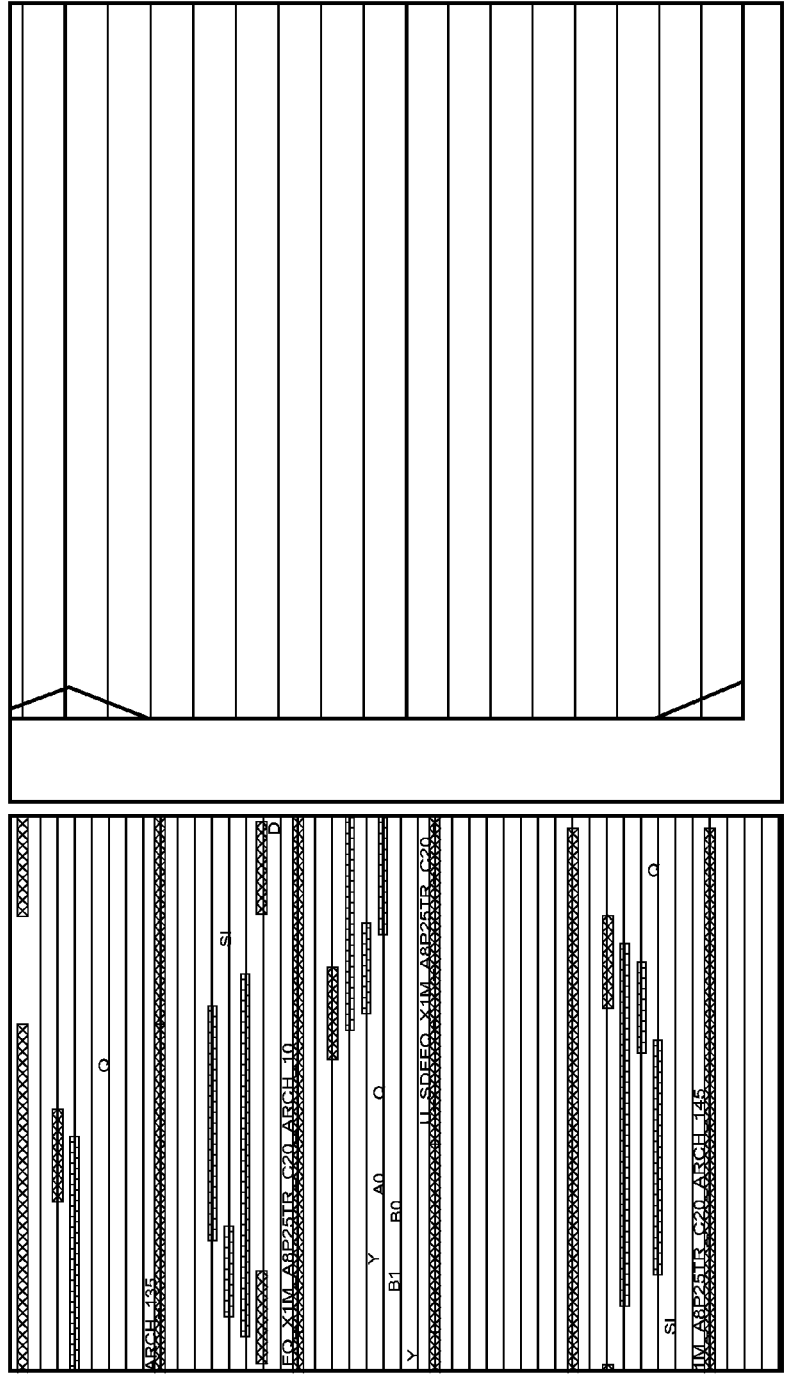

FIGS. 13, 14 and 15 schematically illustrate aspects of offsetting (moving/dithering) M2 tracks (conductors) formed with initial further conductor position so that they have a modified further conductor position, e.g. that better alsigns with the underlying standard cell. In the example of FIG. 13 the standard cells are 8.25 M2 tracks tall. This does not match/align with the initial M2 positions when these are formed. FIG. 14 illustrates the M2 layer after the conductors have been offset (moved/dithered) such that they align (better match) with the underlying position of the standard cells. FIG. 15 illustrates a script that may be executed to modify a file storing an initial M2 layout to generate a file containing a modified M2 layout.

A further example of this technique is described below.

Aligning Routine Tracks to Pins in EDI/ICC
  When the floor plan is created
    EDI System creates first track at an offset from the placement grid set by the OFFSET value for the layer in the LEF file. The track spacing is the PITCH value for the layer defined in LEF. EDI will try to make the upper layer routing tracks align to the lower layers.
    IC Compiler uses the PITCH specified to generate wire tracks in the unit tile and OFFSET is defined while creating the milky way
  Typically, we can re-create the tracks by
    DEF file can be read in the floor plan and Design will reflect the routing tracks defined in the DEF.
    Tracks can be deleted and recreated manually as per the requirement of architecture. A script is available to re-generate the tracks in EDI/ICC in such a way that required offset value can be assigned to all the rows.

Pin Pre-Processing For FRAM and LEF
  While creating the FRAM view of library
    Techfile with M2 pitch of 64 nm has to be replaced by techfile with M2 pitch of 48 nm (cell height multiple) for wire track generation
    All other steps for FRAM generation carried out with the techfile with M2 pitch of 64 nm
    Results in via regions in the FRAM view not aligning to the M2 tracks
    Routing still works, but ARM is concerned about runtime for real designs
    Working with Synopsys to determine best course of action
  Pre-processing of the LEF view by the router just before P&R
    EDI now pre-processes the LEF view to predetermined pin density in the cells and preferred V1 landing sites
    Not possible to work around the fact the preferred V1 sites are wrong
    Routing runs fine, but one of the reasons for the pre-processing is improved TAT in the router (as well as improved placement).

Figure 16:
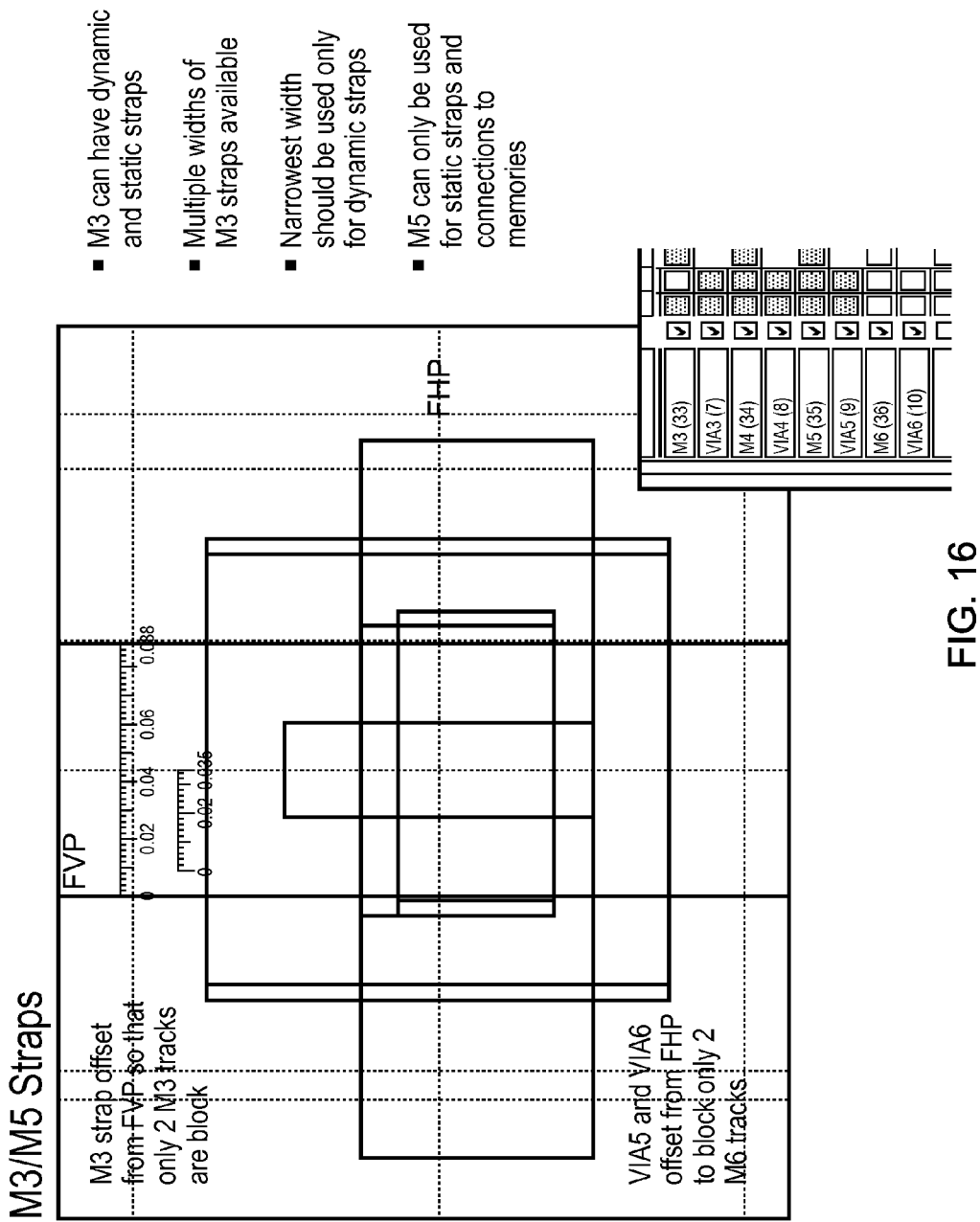
Figure 17:
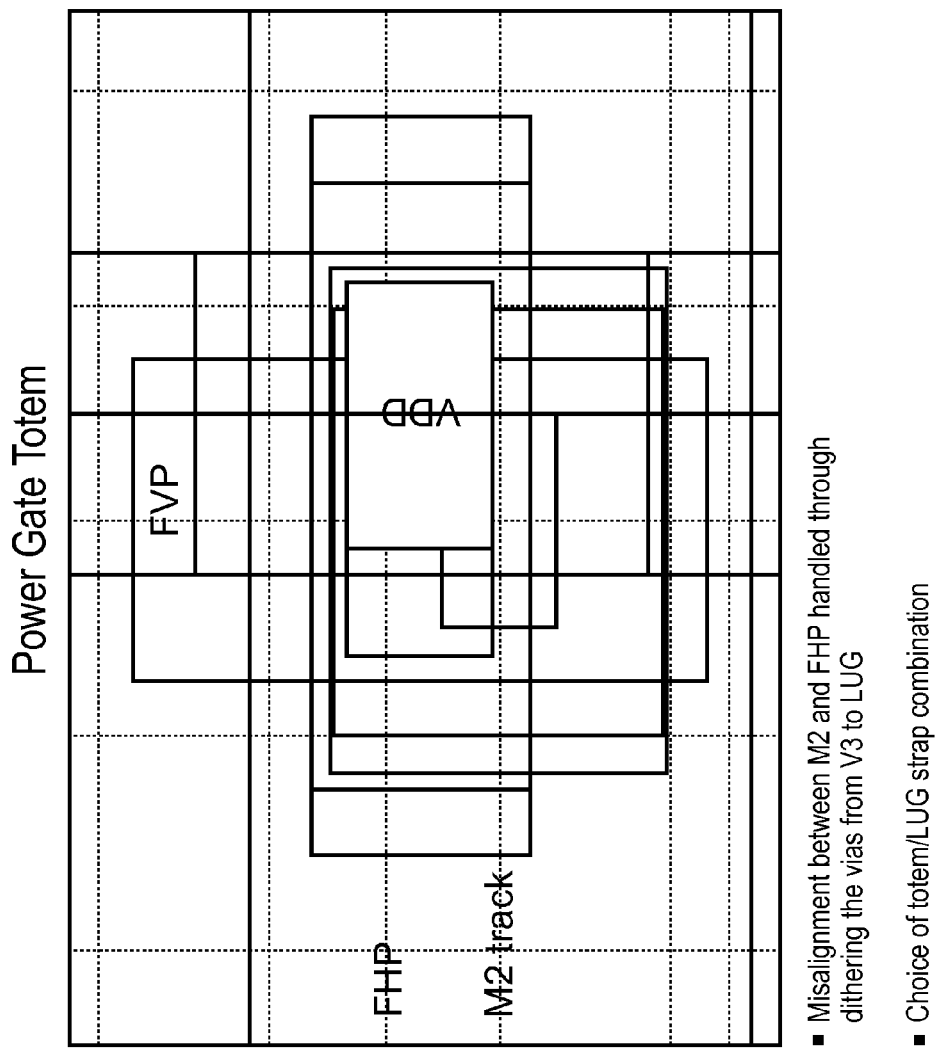

FIGS. 16 to 18 schematically illustrate moving/offsetting/dithering via placement and the use of dynamic and static straps. The vias may be moved so that they block fewer tracks (i.e. better routing is possible). The terminology used in FIGS. 16 to 18 includes:
  LUG, lowest upper grid
  FVP, fundamental vertical pitch
  FHP, fundamental horizontal pitch A dynamic strap provides a power supply that may be switched off, e.g. gated VDD.

A static strap provides a power supply that is always on, or always enabled, e.g. normal VDD.

A "Totem" is a via stack combination which extends between multiple layers of metal, for example a totem may extend from M6 to M2, that only has vias, and metal layers covering vias. In this case, the M3, M4 and M5 layers are provided to cover the via. The wire (metal layer) in a Totem is provided to form part of the via stack.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
a plurality of standard cells having a plurality of standard-cell conductors in a standard-cell conductor layer, said plurality of standard-cell conductors disposed substantially parallel to each other; and
a plurality of further conductors in a further layer separate from said standard-cell conductor layer, said plurality of further conductors disposed substantially parallel with said plurality of standard-cell power conductors, wherein
at least one of said further conductors is disposed at an offset position relative to a sequence of conductors starting at a boundary of a standard cell and with longitudinal axis spaced by a uniform pitch from each other.

2. An integrated circuit as claims in claim 1, wherein said plurality of standard cell conductors include standard cell signal routing conductors within said plurality of standard cells and said plurality of further conductors include further layer signal routing conductors within said further layer.

3. An integrated circuit comprising:
a plurality of standard cells having a plurality of standard-cell conductors in a standard-cell conductor layer, said plurality of standard-cell conductors disposed substantially parallel to each other; and
a plurality of further conductors in a further layer separate from said standard-cell conductor layer, said plurality of further conductors disposed substantially parallel with said plurality of standard-cell power conductors, wherein
at least one of said further conductors is disposed at an offset position relative to a sequence of conductors starting at a boundary of a standard cell and with longitudinal axis spaced by a uniform pitch from each other, wherein:
said plurality of standard cell conductors include a plurality of standard cell power conductors and said plurality of standard cells are connected to draw power from said plurality of standard-cell power conductors; and
said plurality of further conductors include a plurality power grid conductors in a further layer separate from said standard-cell conductor layer, said plurality of power grid conductor disposed substantially parallel with and overlapping corresponding ones of said plurality of standard-cell power conductors, wherein
at least one of said power grid conductors is disposed overlapping a corresponding one of said plurality of standard-cell power conductors and has a grid-conductor median longitudinal axis offset by an offset distance in a direction within said further layer, and transverse to said grid-conductor longitudinal median axis, from a perpendicular projection into said further layer of a standard-cell power-conductor median longitudinal axis of said corresponding one of said plurality of standard-cell power conductors.

4. An integrated circuit as claimed in claim 3, comprising a plurality of routing conductors in said further layer, said plurality of routing conductors disposed substantially parallel with said plurality of power grid conductors.

5. An integrated circuit as claimed claim 4, wherein said plurality of power grid conductors and said plurality of routing conductors and are disposed at distances from each other meeting a minimum conductor spacing requirement.

6. An integrated circuit as claimed in claim 4, wherein at least some of said plurality of routing conductors have a routing-conductor width and are disposed at relative to one another such that a distance between adjacent ones of said plurality of routing conductors is substantially equal to a minimum distance that meets said minimum conductor spacing requirement.

7. An integrated circuit as claimed in claim 4, wherein at least some said plurality of routing conductors are spaced from each other by a substantially constant conductor pitch value.

8. An integrated circuit as claimed in claim 7, wherein a position for a routing conductor disposed following said substantially constant pitch value that would violate said minimum conductor spacing requirement is left vacant.

9. An integrated circuit as claimed in claim 4, wherein said at least one of said power grid conductors is neighboured by a first neighbouring routing conductor and a second neighbouring routing conductor and said offset is such that such that said at least one of said power grid conductors is closer to said first neighbouring routing conductor than to said second neighbouring routing conductor.

10. An integrated circuit as claimed in claim 4, wherein said plurality of power grid conductors have a greater width in said further layer than said plurality of routing conductors.

11. An integrated circuit as claimed in claim 3, wherein said standard-cell power conductors are connected to said power grid power conductors with power connection vias.

12. An integrated circuit as claimed in claim 3, wherein said plurality of standard-cell power conductors and said plurality of power grid conductors are disposed along opposite parallel edges of said standard cells.

13. An integrated circuit as claimed in claim 3, wherein
at least some said plurality of routing conductors are spaced from each other by a substantially constant conductor pitch value P and said plurality of standard cells have a dimension perpendicular to said plurality of routing conductors and parallel to said standard-cell layer that is N*P, where N is a positive integer value greater than 3, and
adjacent power grid conductors within said plurality of power grid conductor are offset.

14. An integrated circuit as claimed in claim 3, wherein
at least some said plurality of routing conductors are spaced from each other by a substantially constant conductor pitch value P and said plurality of standard cells have a dimension perpendicular to said plurality of routing conductors and parallel to said standard-cell layer that is N*(P/2), where N is a positive integer value greater than 6, and
alternating ones of said plurality of power grid conductor are offset.

15. An integrated circuit as claimed in claim 3, wherein said standard-cell conductor layer is a metal one layer of said integrated circuit.

16. An integrated circuit as claimed in claim 15, wherein said further layer is a metal two layer of said integrated circuit.

* * * * *